United States Patent [19]
Taylor et al.

[11] Patent Number: 5,835,965
[45] Date of Patent: Nov. 10, 1998

[54] MEMORY SYSTEM WITH MULTIPLEXED INPUT-OUTPUT PORT AND MEMORY MAPPING CAPABILITY

[75] Inventors: Ronald T. Taylor, Grapevine; Sudhir Sharma, Plano; Michael E. Runas, McKinney, all of Tex.

[73] Assignee: Cirrus Logic, Inc., Fremont, Calif.

[21] Appl. No.: 637,073

[22] Filed: Apr. 24, 1996

[51] Int. Cl.[6] .................................................. G06F 12/00
[52] U.S. Cl. .......................................... 711/211; 711/202
[58] Field of Search ................................... 395/412, 405, 395/421.01; 711/202, 5, 24

[56] References Cited

U.S. PATENT DOCUMENTS

| | | | |
|---|---|---|---|
| 3,906,254 | 9/1975 | Lane et al. ................................. | 326/68 |
| 4,039,862 | 8/1977 | Dingwall et al. ........................ | 327/333 |
| 4,450,371 | 5/1984 | Bismarck ................................. | 326/17 |
| 4,486,670 | 12/1984 | Chan et al. ............................... | 326/81 |
| 4,730,131 | 3/1988 | Sauer ....................................... | 326/24 |
| 4,914,318 | 4/1990 | Allen ....................................... | 327/211 |
| 4,943,740 | 7/1990 | Gulczynski ............................. | 326/129 |
| 4,978,870 | 12/1990 | Chen et al. .............................. | 326/68 |
| 5,285,115 | 2/1994 | Tsuji ........................................ | 327/77 |
| 5,317,712 | 5/1994 | Peek et al. ............................... | 711/172 |
| 5,319,755 | 6/1994 | Farmwald et al. ....................... | 395/284 |
| 5,329,171 | 7/1994 | Shimizu et al. .......................... | 327/78 |
| 5,369,319 | 11/1994 | Good et al. .............................. | 327/73 |
| 5,399,913 | 3/1995 | Widener et al. ......................... | 327/108 |
| 5,408,129 | 4/1995 | Farmwald et al. ....................... | 257/692 |
| 5,430,676 | 7/1995 | Ware et al. ............................. | 365/189.02 |
| 5,430,859 | 7/1995 | Norman et al. ......................... | 711/103 |
| 5,434,817 | 7/1995 | Ware et al. ............................. | 365/189.01 |
| 5,649,125 | 7/1997 | Tietjen et al. ........................... | 395/306 |
| 5,694,557 | 12/1997 | Yang ....................................... | 395/309 |

*Primary Examiner*—Eddie P. Chan
*Assistant Examiner*—Kevin Verbrugge
*Attorney, Agent, or Firm*—James J. Murphy; Steven A. Shaw

[57] ABSTRACT

A memory 600 including an array of memory cells 201 and a plurality of input/output terminals 220 for receiving control bits during control cycles and accessing selected ones of the cells 201 during data access cycles. A command bit input terminal 221 is provided for receiving command bits for initiating the control cycles and a mapping input terminal 222 is provided for receiving a mapping enable signal to initiate a mapping mode. Circuitry 215/216 is provided for decoding control bits received during at least one control cycle occurring during a mapping mode for allowing a mapping of a set of addresses for accessing the cells of the array 201.

24 Claims, 12 Drawing Sheets

MEMORY SYSTEM WITH MULTIPLEXED INPUT-OUTPUT PORT AND MEMORY MAPPING CAPABILITY

CROSS-REFERENCE TO RELATED APPLICATION

The following co-pending and co-assigned applications contain related information and are hereby incorporated by reference:

U.S. patent application Ser. No. 08/534,279, entitled CIRCUITS, SYSTEMS AND METHODS FOR MEMORY MAPPING AND DISPLAY CONTROL SYSTEMS USING THE SAME, filed Sep. 27, 1995;

U.S. Pat. No. 5,537,353, entitled LOW PIN COUNT— WIDE MEMORY DEVICES AND SYSTEMS AND METHODS USING THE SAME, filed Aug. 31, 1995;

U.S. patent application Ser. No. 08/591,864, entitled CIRCUITS, SYSTEMS AND METHODS FOR REDUCING POWER LOSS DURING TRANSFER OF DATA ACROSS AN I/O BUS, filed Jan. 25, 1996; and U.S. patent application Ser. No. 08/638,953, entitled A MEMORY SYSTEM WITH MULTIPLEXED INPUT—OUTPUT PORT AND SYSTEMS AND METHODS USING THE SAME, filed concurrently herewith.

FIELD OF THE INVENTION

The present invention relates in general to electronic circuits and devices and in particular to a memory system with a multiplexed input-output port and memory mapping capability and systems and methods using the same.

BACKGROUND OF THE INVENTION

Most memory subsystems employed in currently available computer systems are either constructed from static random access memory devices (SRAMs) or dynamic random access memory devices (DRAMs). Each type of memory device has advantages and disadvantages, and as a result DRAMs and SRAMs are typically restricted to different applications. SRAMs are faster and are typically used in those applications where fast access times and high bandwidth are critical, such as in cache memories. SRAMs however consume more power, are more expensive to fabricate, and provide fewer cells (bits) per given chip space. On the other hand, while slower than SRAMs, DRAMs are typically less expensive, consume substantially less power, and provide more bits in the same chip space (i.e. have a higher cell density). DRAMs are typically used to construct those memory subsystems, such as system memories and display frame buffers, where power conservation and cell density are more critical than speed. In most computing systems, it is these subsystems which dominate the system architecture, and hence, DRAMs remain the prevalent type of memory device on the market.

In the vast majority of presently available commercial DRAMs, the maximum number of available data input/output pins is 16, allowing access to a maximum of 16 bits per random access or page cycle. This presents a problem in the construction of state of the art computing systems, where the data buses are as wide as 64 or 72 bits. For example, to support a 64-bit wide data bus, four parallel "by 16" devices are required per bank of memory. Multiple chips in turn require additional board space, increase power consumption and increase the number of required interconnections on the printed circuit boards. Further, since monolithic DRAMs are constructed in fixed sizes, such as 512 K Bytes or 2 Mbytes, memory space is often wasted. In other words, depending on whether 512 Kbyte or 2 MByte devices are used, each system memory bank may have a corresponding capacity of 2 MByte or 8 MBytes respectively, assuming four by 16 devices are used to serve a 64-bit bus. If only an intermediate capacity is required per bank, such as 3 MBytes, the larger incrementation must be selected and substantial memory space is wasted.

It would be advantageous to construct DRAMs with wider data ports more suitable for supporting wide state of the art data buses. For example, two DRAMs each with 32 data pins or only one DRAM with 64 data pins could support a 64-bit bus during a single random or page access. However, increased pin count almost always increases device cost. In devices such as the CPU, where only a single unit is required per system, the increased cost associated with increased pin count can usually be tolerated. In contrast, such cost increases normally cannot be tolerated in the case of memory devices, since a significant number of memory devices are normally required per system, typically between 10 and 20 in current architectures. The problem of pin count is particularly difficult to address if a 64-bit wide device is considered. Here, at least 64 data pins and approximately 21 other pins (for addresses, power and control signals) would be required. Currently available packages come in 60 and 100 pin counts, and therefore, in this case, the more expensive 100 pin package would have to be selected, even though a large number of pins would go unused.

Another disadvantage found in conventional DRAMs is the complex timing scheme required to input row and column addresses through the multiplexed address ports normally employed. A multiplexed address port, and consequently a multiplexed address bus at the system level, allows a reduction in the number of pins required for addressing. Typically, the row address bits are presented to the address pins and latched into the DRAM device with a row address strobe ($\overline{RAS}$) signal provided by the system core logic. The column address bits are then presented at the same address pins and latched in with a column address strobe ($\overline{CAS}$) signal. During page mode, additional column addresses are input with additional active cycles of $\overline{CAS}$. While the multiplexed address port system save pins, its makes addressing at both the device and system level substantially more complicated. Further, when multiple chips are used, multiple $\overline{RAS}$ and/or $\overline{CAS}$ signals are often required for bank (chip) select, further complicating the timing scheme. Among other things, this also increases device and system costs.

At the system level, additional problems arise when designing a scheme for individually accessing each memory device in a multiple device memory subsystem. In currently available systems, the associated processor or controller communicates with a given memory subsystem through "glue" or "core" logic. The glue (core) logic is typically programmed to assign each subsystem a unique set of addresses in the processor/controller address space as a function of socket or board position. The core logic then routes requests for access to a selected subsystem via the expected socket. This technique is inflexible since each memory subsystem and the corresponding physical socket are inseparable. Thus for example, if a socket is assigned to maintain a memory module of a certain address space, it becomes impossible to insert another memory module of a different address space. Among other things, such inflexibility makes system modification or upgrade substantially more difficult.

Thus, the need has arisen for circuits and methods for implementing wide memory devices. In particular, such circuits and methods should be applicable to DRAM memory devices, although not necessarily limited thereto. In implementing such devices, the pin count should be minimized and the address timing substantially simplified. Additionally, such circuits and methods should allow for implementing wide memory devices which can be used in systems in which device addressing is independent of board location.

SUMMARY OF THE INVENTION

According to a first embodiment of the principles of the present invention, a memory is provided which includes an array of memory cells and a plurality of input/output terminals for receiving control bits during control cycles and accessing selected ones of the cells during data access cycles. The memory also includes a command bit input terminal for receiving command bits for initiating the control cycles and a mapping input terminal for receiving a mapping enable signal to initiate a mapping mode. The memory further includes circuitry for decoding control bits received during at least one control cycle occurring during a mapping mode for allowing mapping of a set of addresses for accessing the cells of the array.

According to a second embodiment of the principles of the present invention, memory is provided which includes an array of memory cells and a plurality of multiplexed terminals for accessing addressed cells in the array during data access cycles and inputting opcodes and addresses during command and control cycles. The memory further includes circuitry for addressing the array, the circuitry for addressing responding to an address set including a starting address and an ending address. Additionally, the memory includes circuitry for mapping the address sets during a mapping mode. The circuitry for mapping is operable during a first command and control cycle in the mapping mode to input and store the address space starting address in response to a write opcode. The circuitry for mapping is operable during a second control cycle in the mapping mode, to output an address space ending address in response to a read opcode.

The principles of the present invention are also embodied in a memory system which includes a plurality of memory devices and a system master. Each of the memory devices includes an array of memory cells and a plurality of multiplexed terminals for accessing addressed cells in the array during data access cycles and inputting opcodes and addresses during command and control cycles. Each memory device also includes an input for receiving a signal for initiating the command and control cycle and circuitry for addressing the array, the circuitry for addressing responding to addresses received during selected ones of the command and control cycles including at least one bit uniquely identifying the corresponding memory device. Each memory device additionally includes an input for receiving a mapping signal for initiating a mapping mode and circuitry for decoding control bits received during control cycles occurring during the mapping mode for allowing mapping of a set of addresses for accessing the cells of the array. The system master is operable to present a mapping signal to a first one of the memory devices to initiate mapping of the first memory device. The system master also presents a signal to initiate a first command and control cycle and a starting address and command to write the starting address into the first memory device, the starting address including at least one bit uniquely identifying the first amended memory device. The system master also presents a signal to the first memory device to initiate a second command and control signal and a read command to read back an ending address for the first memory.

The principles of the present invention are also embodied in methods for mapping a memory device having an array of memory cells, a plurality of input/output terminals for receiving control bits during control cycles and accessing selected ones of the cells during data access cycle, a command bit input terminal for receiving command bits for initiating the control cycle, a mapping input terminal for receiving a mapping enable signal to initiate a mapping mode and circuitry for decoding control bits received during at least one control cycle in the mapping mode to allow mapping of a set of addresses for accessing the cells in the array. According to one such method, a mapping enable signal is presented to the mapping input to initiate a mapping mode. A first command bit is provided to the command input terminal to initiate a first control cycle. An address write command is presented as selected ones of the input/output terminals in a starting address including at least one bit uniquely identifying the memory and presented at selected ones of the input/output terminals written into the memory. A second command bit is presented to the command input terminal to initiate a second control cycle. An address read command is presented at selected ones of the input/output terminals and a read of an ending address made from the memory.

The principles of the present invention provide for the implementation of wide memory devices, including although not necessarily limited to, wide DRAM memory devices. The principles of the present invention allow for the pin count to be substantially minimized and the address timing simplified. Additionally, the principles of the present invention allow for the implementation of wide memory devices which can be used in systems in which device addressing is independent of board location.

The principles of the present invention advantageously provide for the design and construction of wide memory devices. Among other things, such wide memory devices may be used to reduce the number of memory devices (chips) required to service the wider data buses typically now found in state of the art processing systems. At the same time, devices embodying the principles of the present invention efficiently use the available pinouts, thereby reducing the amount of wasted memory capacity while still allowing for the use of standardized packages. Finally, in those embodiments which do not require externally generated RAS and CAS signals, the address timing is substantially simplified.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–11 of the drawings, in which like numbers designate like parts. While memory devices embodying the principles of the present invention are useful in a wide number of applications, for purposes of illustration, such memory devices will be described in conjunction with a basic processing system architecture typically employed in personal computers.

Figure 1:
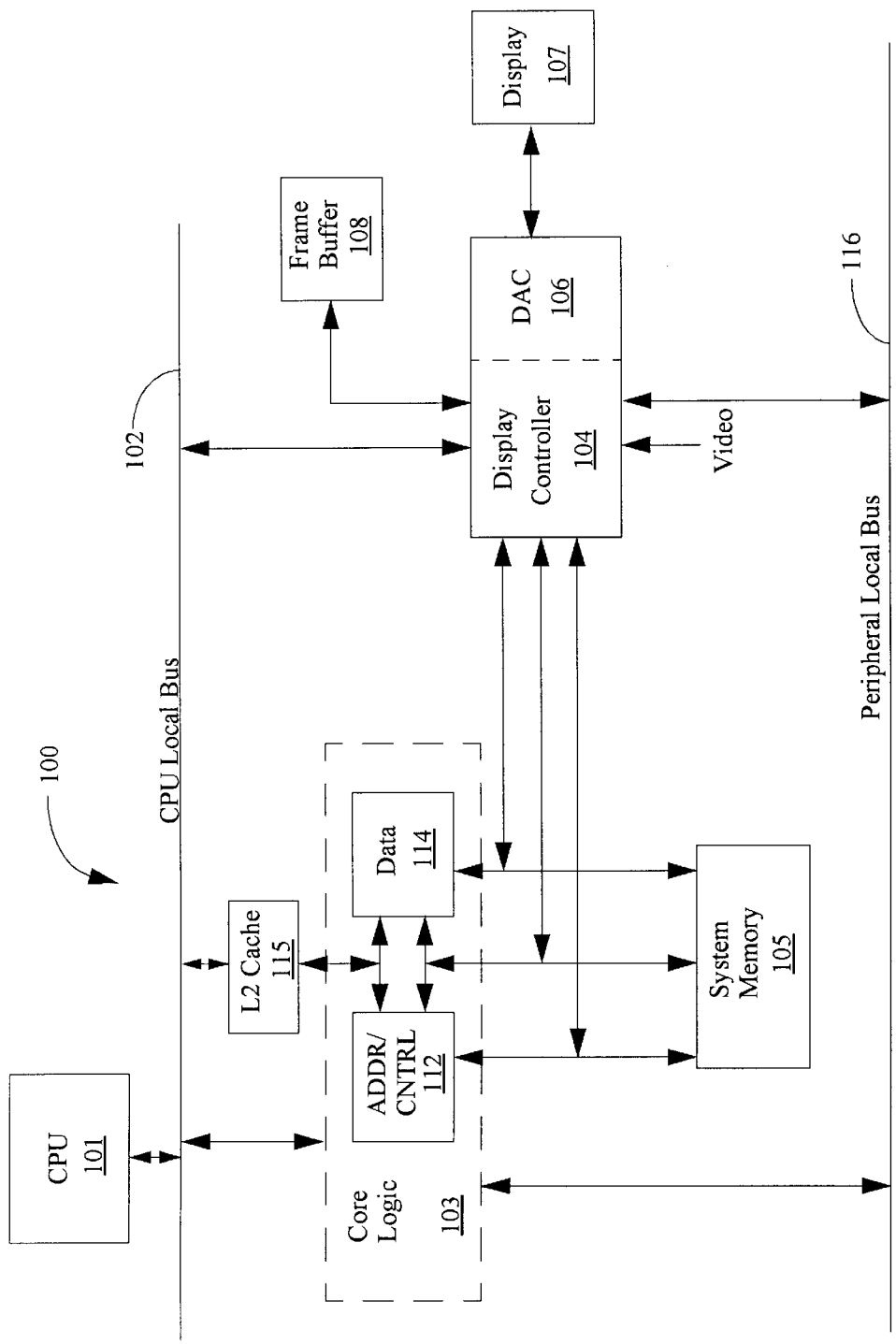
FIG. 1 is a high level system block diagram of an exemplary data processing system architecture in which memory devices and methods embodying the principles of the present invention may suitably be employed.

FIG. 1 is a high level functional block diagram of portion of a processing system 100. System 100 includes a central processing unit 101, a CPU local bus 102, core logic 103, a display controller 104, a system memory 105, a digital to analog converter (DAC) 106, frame buffer 108, a display device 107 and peripheral bus 116.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be for example a general purpose microprocessor, such as an Intel Pentium™ class microprocessor or the like, used in commercial personal computers. CPU 101 communicates with the remainder of system 100 via CPU local bus 102, which may be for example a special bus, or a general bus. As discussed further below, bus 102 may be used to implement the novel memory interface of the present invention.

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. According to the principles of the present invention, core logic 103 is modified in hardware or programmed by software or firmware to interface with a system memory 105 constructed from memory devices 200 described below. One or more core logic chips, such as chip 112 in the illustrated system, are typically "address and system controller intensive" while one or more core logic chips, such as chip 114 in FIG. 1, are "data intensive." Address intensive core logic chip 112 generally: interfaces CPU 101 with the address path of CPU bus 102; maintains cache memory, including the cache tags, set associative cache tags and other data necessary to insure cache coherency; performs cache "bus snooping"; generates the control signals required for DRAMs in the system memory or cache; and controls general management transactions. Data intensive chip 114 generally: interfaces CPU 101 with the data path of CPU bus 102; issues cycle completion responses to address chip 112 or CPU 101; and may abort operations if their cycles are incomplete; and arbitrates for the data path of bus 102.

CPU 101 can directly communicate with core logic 103 or through an external (L2) cache 115. L2 cache 115 may be for example a 256 K Byte fast SRAM device(s). It should be noted that CPU 101 can also include on-board (L1) cache, typically up to 16 kilobytes.

Display controller 104 may be any one of a number of commercially available VGA display controllers modified as required to interface with memory 200, when the principles of the present invention are applied to the display controller/frame buffer interface. For example, display controller 104 may be one of the Cirrus Logic CL-GD754x series of display controllers. The structure and operation of such controllers is described in *CL-GD754x Application Book,* Rev 1.0, Nov. 22, 1994, and *CL-GD7542 LCD VGA Controller Preliminary Data Book,* Rev. 1.0.2, June 1994, both available from Cirrus Logic, Inc., Fremont, Calif., and incorporated herein by reference. Display controller 104 may receive data, instructions and/or addresses from CPU 101 through core logic 103. Data, instructions, and addresses are exchanged between display controller 104 and system memory 105 through core logic 103. Further, addresses and instructions may be exchanged between core logic 103 and display controller 104 via a peripheral (local) bus 116 which may be for example a PCI local bus. Additionally, peripheral bus 116 may be designed and constructed to effectuate the novel interface described below in conjunction with the memory of FIG. 2.

Generally, display controller 104 controls screen refresh, executes a limited number of graphics functions such as line draws, polygon fills, color space conversion, display data interpolation and zooming, and video streaming, and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data needed to drive display 107. In the illustrated embodiment, DAC 106 is integrated with display controller 104 onto a single chip. Depending on the specific implementation of system 100, the display controller 104 may also include a color palette, YUV to RGB format conversion circuitry, and/or X- and Y-zooming circuitry, to name a few options. Displays 107 may be for example a CRT unit, a liquid crystal display, electroluminescent display, plasma display, or other type of display device which displays images on a screen as a plurality of pixels. It should also be noted that in alternate embodiments, "display" 107 may be another type of output device such as a laser printer or similar document view/print appliance.

Figure 2:
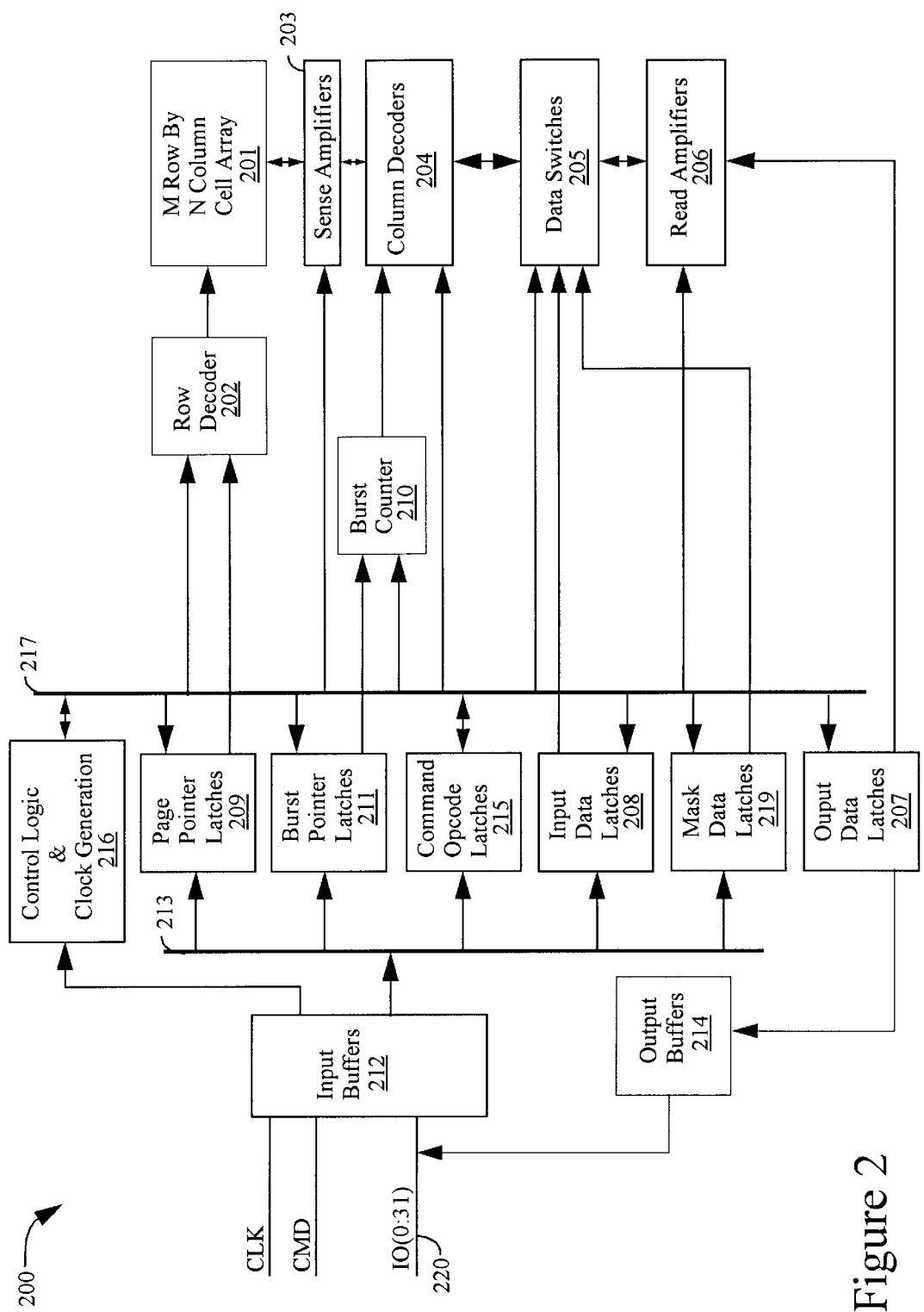
FIG. 2 is a more detailed functional block diagram of an exemplary memory subsystem embodying the principles of the present invention.

FIG. 2 is a functional block diagram of a memory system 200 embodying the principles of the present invention. In the preferred embodiment, the memory system 200 is fabricated on a single integrated circuit chip. In alternate embodiments, a memory system 200 may be fabricated on multiple chips.

Memory system 200 includes an array 201 of memory cells arranged in M number of rows and N number of columns. In the preferred embodiment, cell array 201 comprises an array of dynamic random access memory (DRAM) cells with each row of cells associated with a conductive wordline and each column of cells associated with at least one conductive bitline. The principles of the present invention are not strictly restricted to DRAM cell arrays. Thus, for example, in alternate embodiments, cell array 201 may be an array of static random access memory (SRAM) cells, ferroelectric random access memory cells (FRAM), read-only memory (ROM) cells, electrically programmable read-only memory (EPROM) cells or electrically-erasable, electrically-programmable read-only memory (EEPROM) cells.

One out of M rows (pages) is selected for access through a row decoder 202 coupled to the wordlines of array 201 in response to received page pointer bits. The bitlines of array 201 are coupled to a plurality of sense amplifiers 203 and a column decoder 204. Among other things, sense amplifiers 203 differentially sense and latch the data appearing on the bitlines associated with the cells along the row selected by row decoder 202 during a read. During an access (i.e., read or write), column decoder 204 selects, in response to received burst pointer bits, w number of bitlines to access w number of cells (i.e., a w-bit wide storage location) along the row selected by row decoder 202. For discussion purposes, it will be assumed that memory 200 is a "log 32" device where w=32.

In the preferred embodiment, row decoder 202, sense amplifiers 203, and column decoder 204 are constructed from dynamic circuitry, although in alternate embodiments, static circuitry also may be used. For description of the fundamental principles upon which the construction and operation of cell array 201, row decoder 202, sense amplifier 203, and column decoder 204 are based, please refer to the following selected articles: "A 64-k Dynamic RAM Needs Only One 5-volt Supply to Outstrip 16k Parts", G. R. Mohan Rao and John Hewkin, Electronics, Sep. 28, 1978, pp. 109–116; "A 1Mb DRAM With Design-For-Test Functions," J. Neal, B. Holland, S. Inoue, W. K. Loh, H. McAdams and K. Poteet, International Solid State Circuit Conference 1986, Digest of Technical Papers, pp. 264–265; "A 4 Mb DRAM With Half Internal-Voltage Bitline Precharge", International Solid State Circuit Conference 1986, Digest of Technical Papers, pp. 270–271; "A Full Bit Prefetch Architecture For Synchronous DRAMs", T. Sunaga, K. Hosokawa, Y. Nakamura, M. Ichinose, A Moriwaki, S. Kakimi and N. Kato, IEEE Journal of Solid State Circuits, Vol 30., No. 9, September 1995, pp. 994–1005; and "DRAM Macros For ASIC Chips", IEEE Journal of Solid State Circuits, Vol 30., No. 9, September 1995, pp. 1006–1014, each incorporated herein by reference.

According to the principles of the present invention, memory device 200 includes a plurality of multiplexed input/output pins 220. In the illustrated embodiment, a 32-bit wide input/output port (pins) 220, labelled IO(0:31), input or output data during a data access mode (cycle) and receive command, control and address bits during a command and control mode (cycle). While 32 input/output pins (terminals) are shown in the illustrated embodiment, it should be noted that the principles of the present invention can be advantageously applied to devices of different pinouts, such as devices having a 64- or 72-pin input/output pinout. In the preferred embodiment, a command bit (CMD) which is received through a selected input (pin) controls and times the address/control and data access modes.

In the data access mode, data is exchanged with column decoder 204 through a data switch 205. Data switch 205 may be for example, an array of gates, latches, or sense amplifiers. During a read operation, data switches 205 couple column decoders 204 with read amplifiers 206 and output data latches 207. During a write operation, data switches 205 couple column decoders 204 with input data latches 208. During a write masking operation, data switches 205, configured in response to mask data stored in mask data latches 219, mask a selected number of bits which will not be modified during a given subsequent write operation. Each of these operations will be discussed in further detail below.

Data being read from array 201 is pipelined through read amplifiers 206 and output latches 207 to output buffer 214. When enabled, output buffers 214 directly drive the input/output port (pins) IO(0:31). Data being written into array 201 is input through input buffers 212 to an internal bus 213 and latched into input data latches 208. Input data latches 208 in turn present data directly to data switches 205. During a write operation, output buffers 214 are in a tri-state (high impedance) state.

During the command and control mode, command and control bits are presented to at least some selected input/output pins IO(0:31) and input through input buffers 212 to internal bus 213. Command opcode bits are received and latched into command opcode latches 215. Depending on the operation, page pointer (row address) bits are selectively latched from bus 213 into page pointer latches 209 and burst pointer bits are selectively latched into burst pointer latches 211 from bus 213. During a read or write, the burst pointer bits are loaded from burst pointer latch into a burst counter 210. Burst counter 210 counts (increments or decrements) from the initial burst pointer received from latch 211 to generate a series of column addresses. These column addresses allow access to a pre-determined number of w-bit wide locations through column decoder along the page (row) pointed to by the bits in latches 209. In the preferred embodiment, burst counter counts from the burst pointer until the end of page has been reached or until a page close command or refresh command is received. In alternate embodiments, a final or stopping burst pointer may be latched into burst pointer latches 211 identifying a last location to be accessed in the open page.

The command opcode bits latched into command latch 215 are presented on an internal command and control bus 217 and decoded by control logic and clock generation circuitry 216. Clock and control signals generated in response by control logic/ clock generation circuitry 216 are also distributed by internal control bus 217. The incoming master clock which times the overall operation of memory 200 is received through input buffers 212 and passed to clock generators 217. All inputs and outputs are referenced to the edges of the master clock CLK. Clock generators generate clocks necessary to time the latching of data and commands, the counting of burst counter 210 and for controlling the operation of the dynamic circuitry used in row decoder 202, sense amplifier 203, and column decoder 204.

TABLE I summarizes a preferred set of opcodes and control bits, such as the pointers, and corresponding input pin assignments (numerical values are given in hexadecimal form):

COMMAND TRUTH TABLE

| Command | IO31–IO27 | IO26–IO21 | IO20–IO10 | IO09–IO00 |
|---|---|---|---|---|
| SRON | 01 h | Don't Care | Don't Care | Don't Care |
| SROF | 02 h | Don't Care | Don't Care | Don't Care |
| NOP | 00 h | Don't Care | Don't Care | Don't Care |
| SAC (set burst latency = 1) | 03 h | 00 h | Don't Care | Don't Care |
| SAC (set burst latency = 2) | 03 h | 01 h | Don't Care | Don't Care |
| SAC (set burst latency = 3) | 03 h | 02 h | Don't Care | Don't Care |
| SAC (set page latency = 1) | 03 h | 03 h | Don't Care | Don't Care |
| SAC (set page latency = 2) | 03 h | 04 h | Don't Care | Don't Care |
| SAC (set page latency = 3) | 03 h | 05 h | Don't Care | Don't Care |
| SAM* (set mask) | 04 h | 00 h | Don't Care | Don't Care |
| SAM (enable mask) | 04 h | 01 h | Don't Care | Don't Care |
| SAM (disable mask) | 04 h | 02 h | Don't Care | Don't Care |
| OP | 07 h | Chip Pointer | Page Pointer | Don't Care |
| CP | 08 h | Chip Pointer | Page Pointer | Don't Care |
| FR | 09 h | Chip Pointer | Don't Care | Don't Care |
| PR | 0 Ah | Chip Pointer | Page Pointer | Burst Pointer |
| PW | 0 Bh | Chip Pointer | Page Pointer | Burst Pointer |
| CBP | 0 Ch | Chip Pointer | Page Pointer | Burst Pointer |
| TCP | 0 Dh | Chip Pointer | Don't Care | Don't Care |

*The mask is received on the next data input/output cycle.

The self-refresh on command SRON sets memory 200 into a refresh mode during which a refresh counter and oscillator within control logic 216 increment from the page pointer stored in page pointer latches 209. The resulting sequence of page pointers are used by row decoder 202 to step through the wordlines of cell array 201. As each wordline is activated, sense amplifiers 203 refresh the data appearing on the array bitlines in a conventional manner. Preferably, during a self-refresh operation, the only command which will be accepted by memory 200 is the self-refresh exit command, SROF which terminates refresh operations and prepares the device to accept new commands.

The no operation command NOP indicates that no command/control operation is being performed.

The set attribute clock commands SAC allow an initial page latency and/or an initial burst latency to be set for memory 200. The burst latency in the preferred embodiment is the frequency, in number of master clock periods CLK, between location (column) accesses from an open page. In the illustrated embodiment, burst latencies of 1,2, or 3 may be selected. A burst latency of 1 results in an access with each clock during the subsequent data access cycle, with a burst latency of 2, data is input/output with every other clock and with a burst latency of 3, with every third clock. The page latency is the number of clocks CLK after the opening of the selected page (row) the first location access can be made. In the illustrated embodiment, page latencies of 1, 2, or 3 may be selected. The page and burst latency select options allow the timing of accesses to memory 200 to be adjusted, with respect to the master clock, to meet the data input/output timing requirements of the associated processing circuitry.

The set mask command SAM allows for input of a write mask on the next data input/output cycle. In the illustrated embodiment, where accesses to array 201 are made in 32-bit words, the data mask is preferably 32-bits thereby allowing masking with a 1-bit resolution. Once set, the mask can be selectively enabled or disabled in subsequent command/control cycles using the enable mask and disable mask commands shown in TABLE I.

The open page command OP activates the page pointer held in page pointer latch 209 thereby allowing row decoder 202 to activate (select) the corresponding wordline in array 210. Once the page is open, memory 200 waits for a read or write command opcode to continue operation. Preferably no more than one page can be opened simultaneously with the same most significant page pointer bit.

The close page CP command returns the open page to precharge. If multiple pages have been opened, all are returned to precharge simultaneously.

The function read command FR causes memory 200 to return a 32-bit ID number assigned to the device during the next data input/output cycle. The ID number may be hard-wired into memory 200 or stored in a register, such as with command opcode latches 215, by software. During data accesses, this ID is compared with a received chip pointer allowing selective enablement of individual memory devices 200 in multiple device memory systems.

The page read command PR can be used in at least two ways. First, when used in conjunction with the page and burst pointers, the page read command initiates a burst read starting at the location pointed to by the burst pointer along the page pointed to by the page pointer. Second, when used with a burst pointer alone for a page which has already been opened, this command will execute a burst read starting at the specified initial burst location loaded into burst pointer latches 211.

The page write command WR operates for a write operation similar to the manner in which the PR command operates for a read operation. In this case however, output buffers 214 are set into a tri-state condition and the device accepts input data to be written into locations in array specified by the burst pointer. The PR and PW can be combined provided a one clock cycle latency is allowed to switch the burst over.

The change burst pointer command CBP changes the burst pointer for either a read or a write for a selected open page. If preceded by a page read PR command, the read will continue at the new burst pointer location with the next data input/output cycle after the CBP command has been asserted. If preceded by a page write PW command, the write will continue during the next data access cycle after the CBP command has been asserted, resuming at the new burst pointer location.

Figure 7:
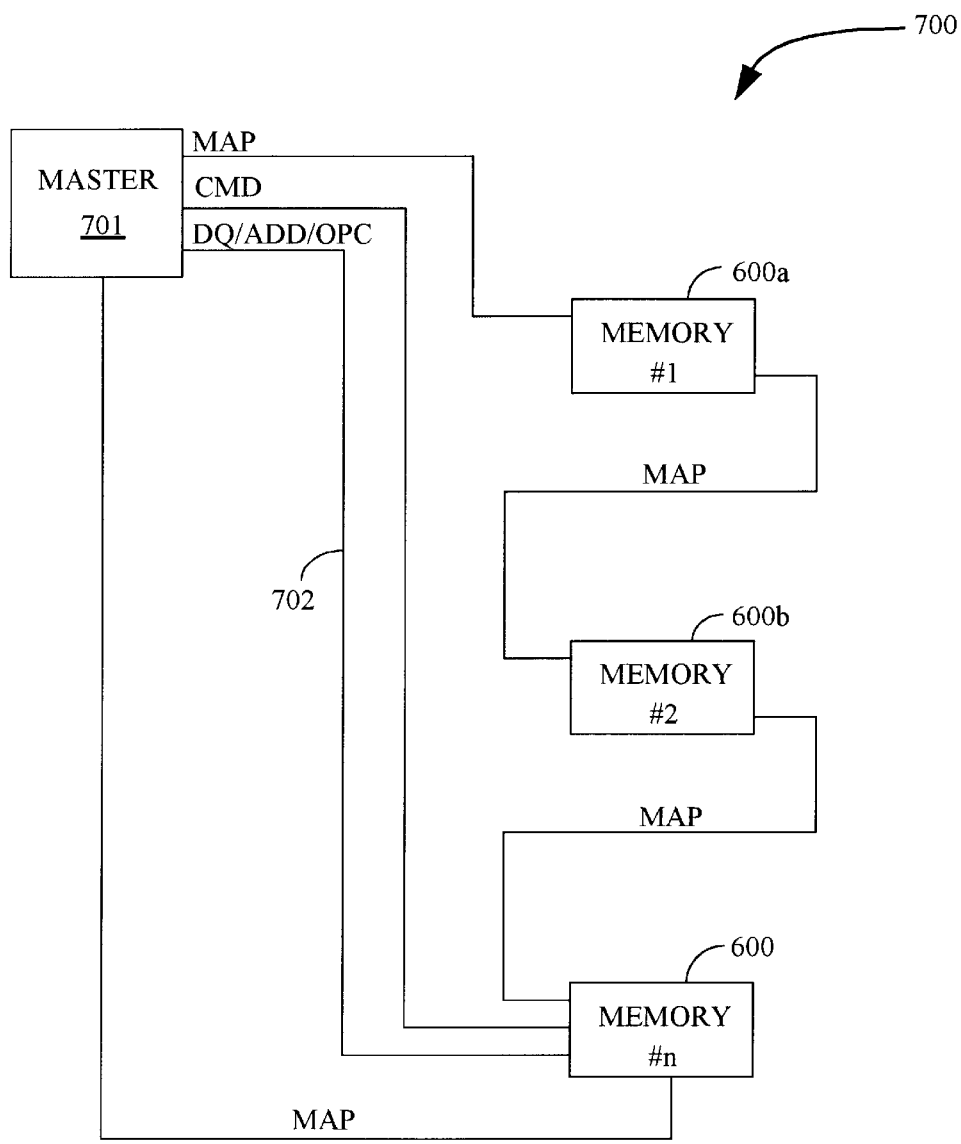
FIG. 7 is an exemplary processing/memory system having self address mapping capability.

The toggle command palette (TCP) opcode provides for individual mapping or remapping of a memory device 600 in a multiple device system such as shown in FIG. 7. The mapping system of the present invention and the operation of the system shown in FIG. 7 will be discussed in detail below. Generally however, the TCP opcode, when asserted, causes all memory devices 600 in the system to electrically decouple from the associated address/data multiplexed bus. The address map of the memory 600 identified by the chip pointer is unlocked, the remaining memories 600 remain mapped with mapping locked. The TCP opcode also allows the command palette of TABLE II given below to control the mapping of the identified memory 600 in lieu of the commands of TABLE I. The commands of TABLE II are also discussed in detail below.

Figure 3A:
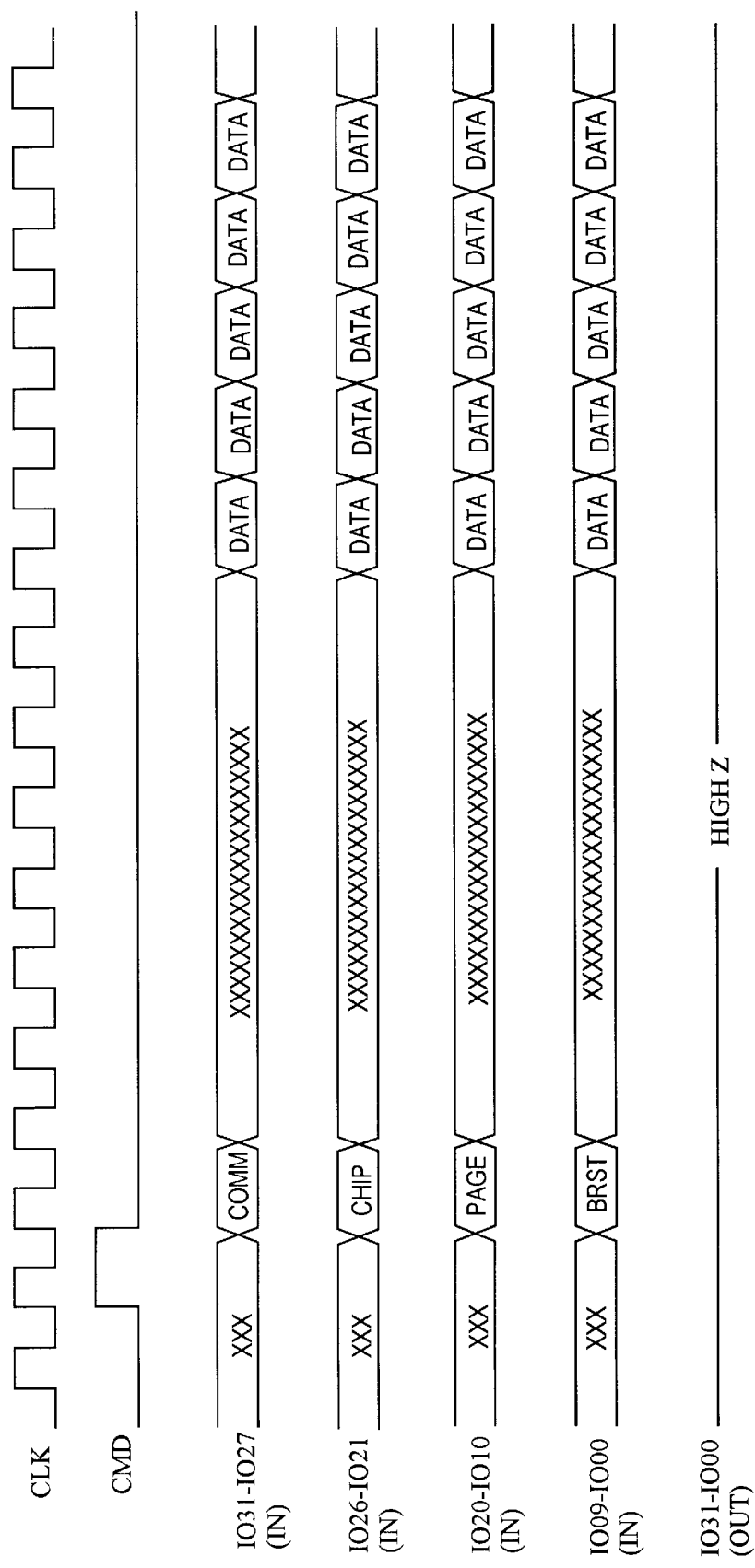
FIGS. 3A and 3B are timing diagrams depicting exemplary page write and page read operations according to the principles of the present invention.
Figure 3B:
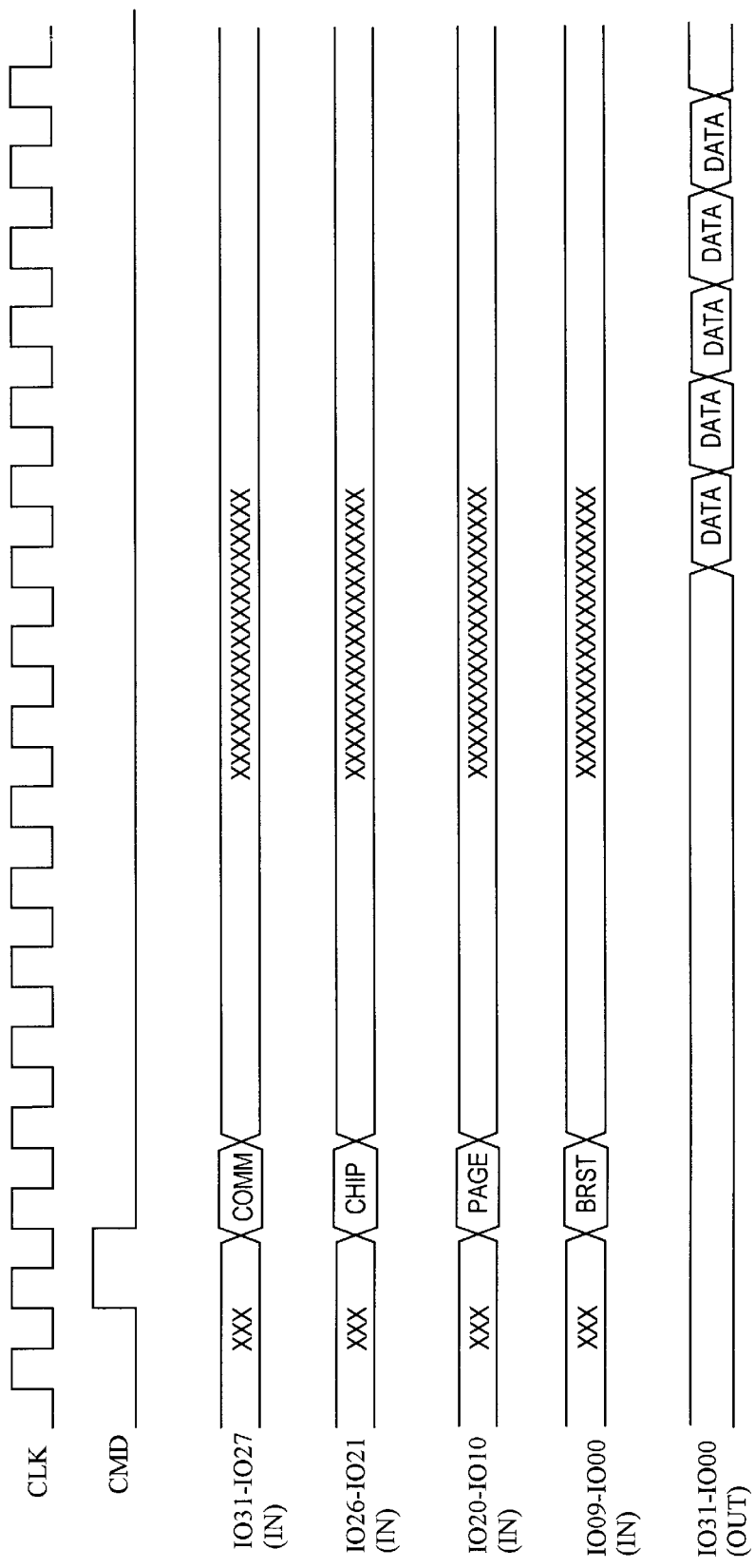

The operation of memory 200 can be best described in conjunction with FIG. 3A and 3B, which are conceptual timing diagrams of representative page read and page write operations. It should be noted that the other operations defined in TABLE I follow a similar timing scheme. Further, in some operations, such as setting the burst and page latencies or setting the mask, the command and control cycle may not be immediately followed by a data access cycle. In such cases, memory 200 idles or resumes accessing the previously selected data stream as appropriate until another command opcode is received and decoded, either during a new command/control cycle initiated by CMD or during the same command/control cycle.

Figure 4:
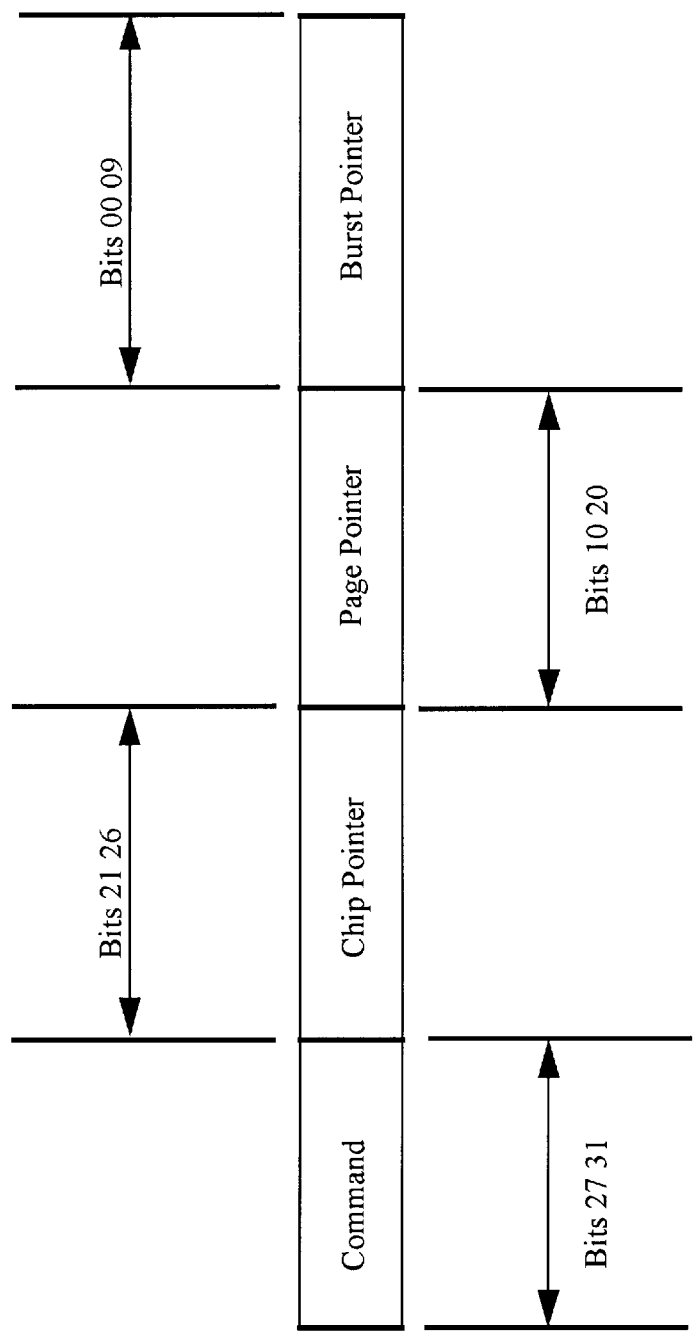
FIG. 4 is an exemplary command and control word received during a selected command and control cycle.

Referring first to the page read timing of FIG. 3A, at the start of the command/control cycle, core logic 103 or processor 101 sets the command bit CMD high. With the command bit high, output buffer 214 is tri-stated and the bits input to bus 213 on the next rising edge of CLK are interpreted as being commands and/or pointers. In the illustrated embodiment, and for both the case of a write (FIG. 3A) and a read (FIG. 3B), the bits received at inputs IO(0:9) constitute the burst pointer, the bits received at inputs IO(10:20) constitute the page (row) pointer, the bits received at inputs IO(21:26) constitute the chip pointer, and the bits received at inputs IO(27:31) constitute the command bits (per TABLE I, for a read the preferred command opcode bits are 0Ah, and for a write, 0Bh). FIG. 4 depicts a typical input word organization for a read or write. These bits are input into the corresponding latches (registers) with clocks generated from the master clock.

The page pointer bits select one row in array 201 and the burst pointer bits select at least one initial w-bit wide location along that row for access. It should be noted that the number of page pointer bits and the number of burst pointer bits required may vary from embodiment to embodiment depending on such factors as the number of rows in array 201 and the number and width (number of physical columns) of each column, among other things. For example, assume that array 201 is arranged as 1,024 rows and 1,024 32-bit columns. In this case, all ten page pointer bits are acquired to select one out of 1,024 rows and all ten column address bits are required to select one 32-bit wide column (i.e. one 32-bit location).

In the preferred embodiment, with the falling edge of the command bit, the data access mode begins for a read or write command (for some other operations shown in Table I memory 200 waits for another command, such as one to start an access). After a delay of a pre-determined number of master clock cycles, to allow for sense amplifiers 203 to set-up, 32-bit words of data can be read or written to/from locations of the selected page (row) as burst counter increments (or decrements) from the received burst counter value. Prior to the start of the depicted operations, one command/control cycle is assumed to have taken place during which the burst latency has been set to 1, for example, per the preferred embodiment of TABLE I, the command bit CMD is set high, an set burst latency command of 03h is presented to inputs IO(27—27) and a 01h presented to chip pointer inputs IO(21–26).

Data switches 205 not only controls the coupling of data between column decoder 204 and the read and write data paths, but also allows for write masking. During a selected command cycle, a set mask command is input, preferably as set forth in TABLE I, and latched into command/chip pointer latch 215. After the command bit CMD goes low, a 32-bit mask is then input through inputs IO(0:31) and latched into mask data latches 218. Control logic 216 configures data switches 205 to mask data received through input latch 208 during subsequent write operations, when masking is enabled by a mask enable command cycle in accordance with TABLE I. With a 32-bit data path, a 32-bit mask will allow masking with a single bit resolution. Masking is disabled using the disable mask command also set out in TABLE I.

It should be noted that the present invention is not limited to instances where a single word of command opcodes and control bits are received during a given command/control cycle. For example, on the first clock edge after CMD transitions low, a first 32-bit word of command opcodes and/or control bits are input and latched and on a subsequent clock, a second 32-bit word of command opcodes and/or control bits are input and latched without the need to re-assert CMD. In this fashion, longer opcodes and/or pointers can be input thereby allowing the performance of additional or more complex operations, access to larger memory arrays, or access to smaller locations, among other things.

Figure 5:
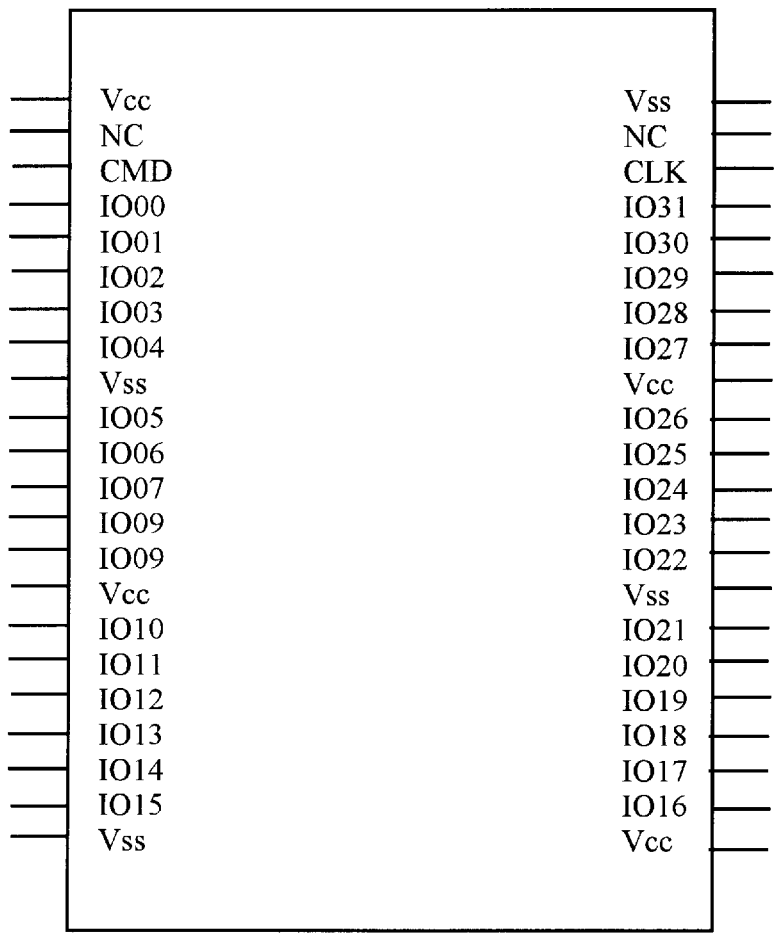
FIG. 5 is one possible pin-out configuration for a memory embodying the principles of the present invention packaged in a standard package.

FIG. 5 is a top plan view diagram depicting a possible pin out configuration for a preferred DRAM embodiment of memory 200. For discussion purposes, a conventional 44-pin, 400 mil, TSOP package is being assumed and that the data word width is 32-bits. It should be noted that in alternate embodiments, the specific pin assignments can change from application to application, depending on such factors as the line assignment in the associated bus and the pin outs of core logic 103 (in a system such as those described above in conjunction with FIGS. 1). It should also be noted that the principles of the present invention are not limited to use in 44-pin TSOP packages, but also may apply to other packages, depending on such factors as width of data word per access and the number of address pins required.

Figure 6:
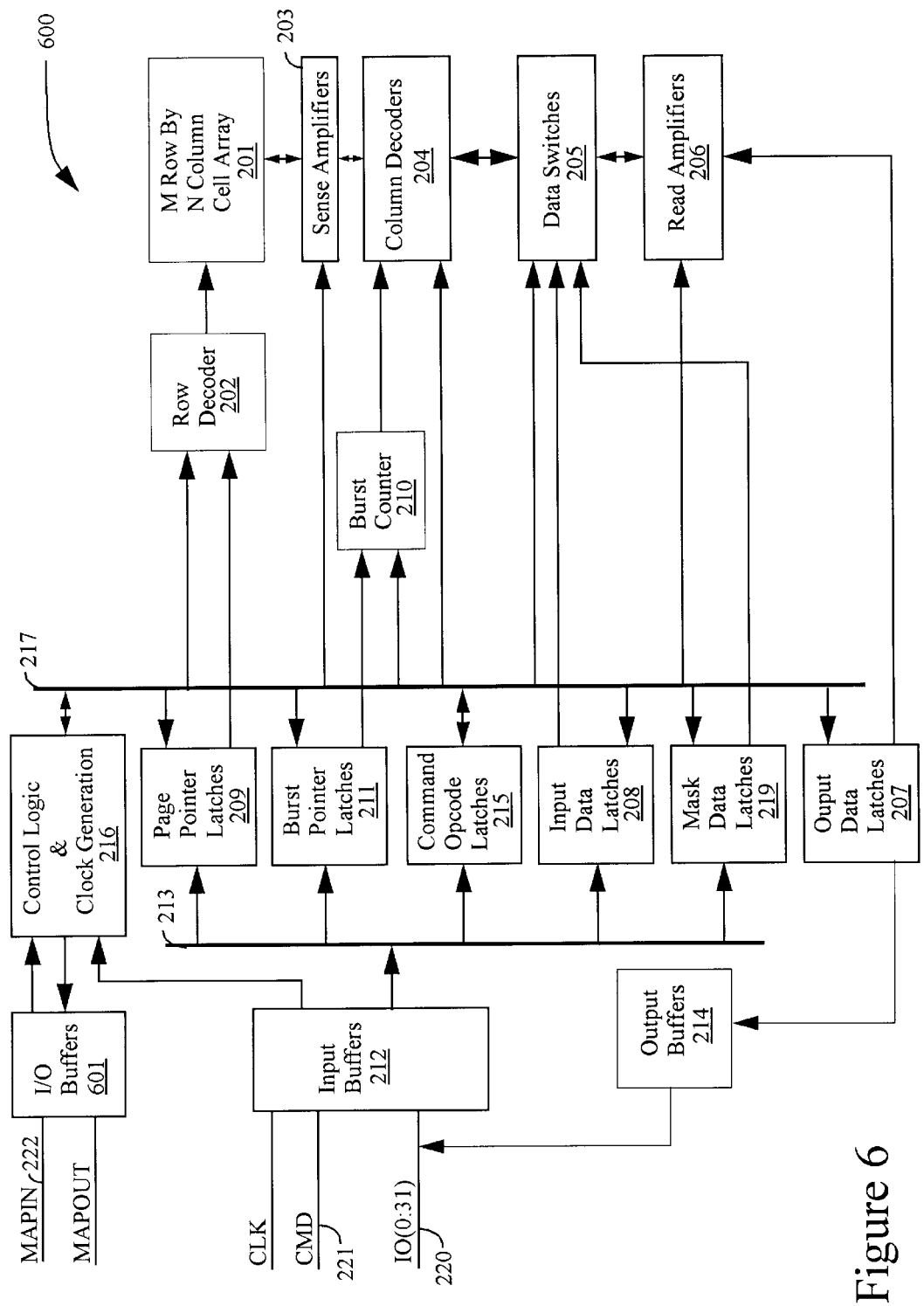
FIG. 6 is a functional block diagram of an alternate memory subsystem suitable for use in memory systems having self address mapping capability according to the principles of the present invention.

FIG. 6 depicts an alternate embodiment of the principles of the present invention. FIG. 6 depicts a memory 600 which includes the major structures and functions described above in conjunction with FIG. 2 plus additional mapping capability. Specifically, memory 600 includes a mapping input MAPIN for receiving a mapping signal through input/output buffers 601 and a mapping output MAPOUT for rippling the mapping signal to another device within a chain of devices.

The mapping functions of memory 600 are best described in conjunction with a description of system 700 depicted in FIG. 7. Generally, system 700 includes a master 701, and an array of memory subsystems 600. Master 701 includes for example a CPU, such as CPU 101 and/or core logic, such as core logic 103, both discussed above. During memory mapping, master 701 presents the mapping signal to the first memory (memory 1) through the corresponding MAPIN port. The first memory 600 is then mapped using the procedure discussed below. The mapping signal is then rippled through the chain of memories 600 as each of the N number of memory devices 600 in the array are mapped. The last memory device 600 in the array returns the mapping signal through its MAPOUT port to master 701 to indicate that mapping of all memories 600 in system 700 is complete. Master 701 also presents the command, data, address, and opcode bits in the manner described above. The operation of memory system 700 is described below in additional detail; however, for a more detailed description of the mapping procedure, reference is now made to co-pending and co-assigned patent application Ser. No. 08/534,279, entitled CIRCUITS, SYSTEMS AND METHODS FOR MEMORY MAPPING AND DISPLAY CONTROL SYSTEMS USING THE SAME, filed Sep. 27, 1995 and incorporated herein for all purposes.

The command opcode latches 215 of each memory 600 include programmable registers for holding one or more chip pointer bits (TABLES I & II) for uniquely identifying the corresponding memory subsystem 600. For discussion purposes assume that each subsystem 600 is associated with a set of addresses, including row and column address bits (page and burst pointers). The number and length of the addresses required to sufficiently address a given memory subsystem 600 will vary depending on such factors as the number of memory cells in the cell array 201 and the number of cells per addressed location. In the preferred embodiment, the lower order address bits are used to specifically address locations within the array 201 of the given memory 600 (i.e. comprise the page pointer and the burst pointer). The chip select bits in the preferred embodiment comprise one or more higher order "prefix" bits. The number and order of chip pointer bits will depend not only on the address spaces of the individual memories 600 but also on the entire address space of all the memories 103 in the array. In the preferred mapping technique, it is these chip select bits which are programmed into the registers of control latches 215 during the mapping process.

A preferred method of mapping the numerous 600 of system 700 according to the principles of the present invention can now be described in detail. Initially, master 701 clears the memory (address) map in which memories 600 reside. This can be done for example by presenting a logic low level on the MAPIN input of the first memory 600 in the chain, and then rippling the logic low level through the remaining memories 600. Preferably, within each memory 600 at least the one or more bit positions of the chip pointer registers (latches) within control logic 215 are cleared to zero.

Figure 8:
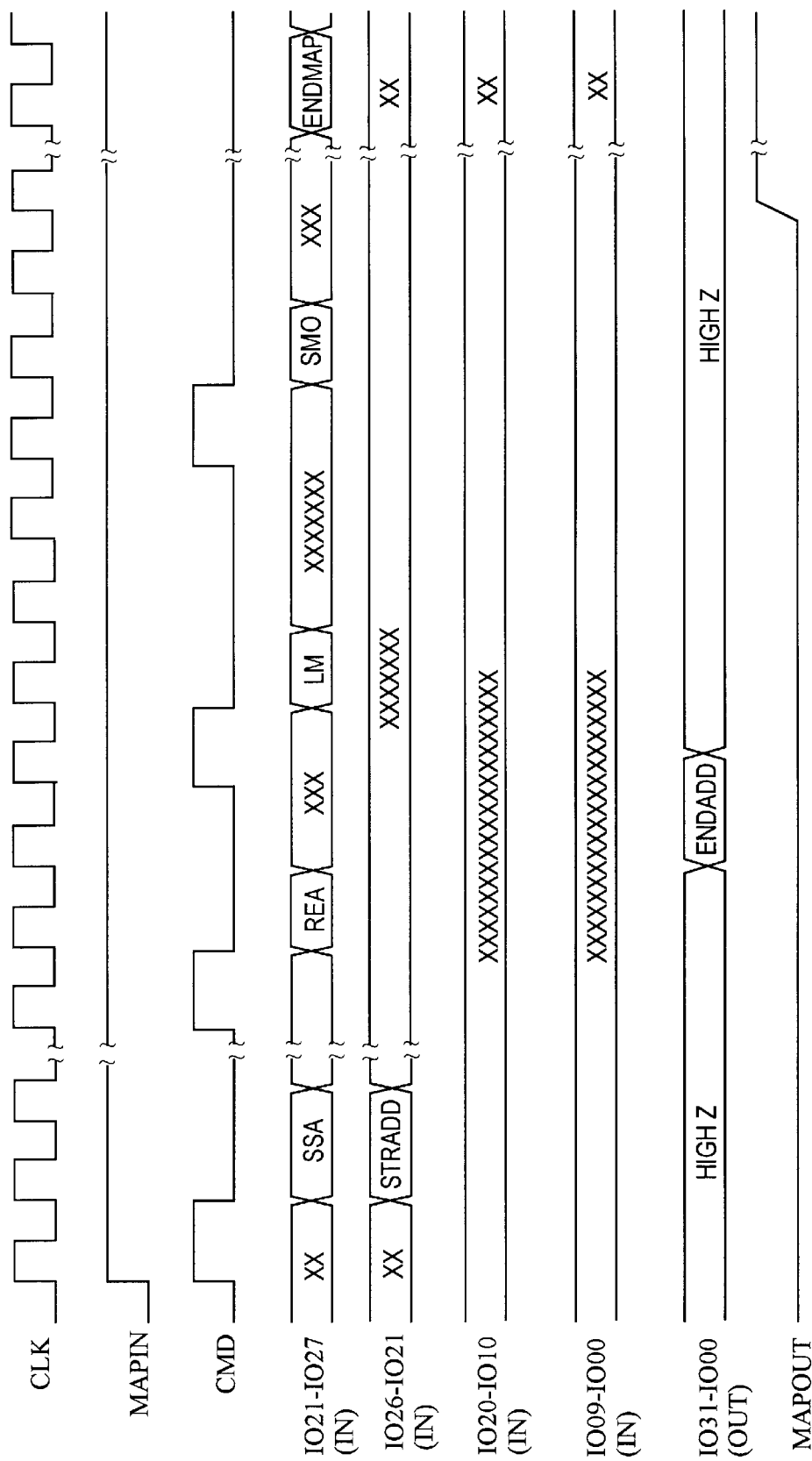
FIG. 8 is a timing diagram illustrating a typical mapping cycle in a system such as shown in FIG. 7 and embodying a memory such as shown in FIG. 6.

The timing of the mapping of a selected memory 600 in system 700 can now be illustrated in conjunction with the conceptual timing diagram of FIG. 8 and TABLE II, which is the command palette for mapping operations. Command palette opcode interpretation takes precedence over the Table I commands by assertion of the TCP (toggle command palette) opcode at the beginning of the mapping procedure.

TABLE II

MAPPING COMMAND PALETTE

| COM-MAND | IO31–IO27 | IO26–IO21 | IO20–IO10 | IO09–IO00 | |
|---|---|---|---|---|---|
| SSA | 00 h | CHIP POINTER | DON'T CARE | DON'T CARE | SET STARTING ADDRESS |
| REA | 01 h | CHIP POINTER | ENDING PAGE POINTER | ENDING BURST POINTER | READ ENDING ADDRESS |
| RE | 02 h | CHIP POINTER | DON'T CARE | DON'T CARE | READ FUNCTION |
| LM | 03 h | CHIP POINTER | DON'T CARE | DON'T CARE | LOCK MAP |
| UM | 04 h | CHIP POINTER | DON'T CARE | DON'T CARE | UNLOCK MAP |
| SMO | 05 h | CHIP POINTER | DON'T CARE | DON'T CARE | SET MAP OUTPUT |

After initialization is complete, master 701 starts the mapping procedure by setting the mapping enable signal MAP on its MAPOUT port to the active (logic high) state. The MAPOUT ports of all of the memories 600 remain in the inactive (logic low) state at this point.

With the control signal MAP from master 701 transitioning to a logic high state, the first memory device 600 in the chain, in this case memory 600a, is enabled for mapping. The command bit CMD is set high to initiate a command and control cycle. On the first rising clock edge after the command signal CMD has transitioned to a logic high state, a set starting address command (SSA) is presented to I/O pins 31-27 along with the starting address STRADD assigned to the given memory 600. In the preferred embodiment, only the chip pointer bits need be entered on the chip select pins IO21–IO26, assuming the lower or starting address bits (the page and burst pointer bits) start at a fixed initial value, such as zero. In alternate embodiments a full address, including the chip pointer bits and burst and page pointer bits can be written in on pins IO00–IO26. In the illustrated embodiment, the prefix (chip select) word is six bits long, but may vary from embodiment to embodiment depending on the number of chips which may be used in the overall system. For the first memory in the chain, the starting prefix STRADD is preferably 0, but could be any other value within the address space of master 701. At least the chip pointer bits of the starting address are latched into the registers within command opcode latches 215 of enabled Memory 1.

A determination is next made of the last (ending) address of the memory 600 being mapped, in this example, memory 600a. In the preferred embodiment, this is achieved by concatenating the assigned chip pointer bits with a stored value within the memory device. For example, in the illustrated embodiment, the six chip pointer bits may concatenate with the highest burst pointer and the highest page pointer to obtain the address set ending address. The concatenation is preferably performed within control logic 216. Subsequently, a new command and control cycle is initiated using the command bit CMD and an ending address read command REA presented by master 701 to read back the ending address to master 701. The ending address, including the chip pointer, the ending page pointer and ending burst pointer, are preferably read back on the next clock edge. Master 701 stores the initial and final addresses to first memory 600a (for example in registers).

In alternate embodiments, each memory 600 may store a value indicative of the size of its address space. This value can then be read back to master 701 using the REA command and used, along with the known starting address, to calculate the respective ending address.

With both the starting and ending addresses known, the mapping for memory 600a is complete. Next, master 701 causes the command bit CMD to transition high and on the next rising clock edge presents a lock map (LM) command to the memory 600 being mapped. This command locks at least the starting and ending addresses for the address space within the corresponding command and control registers 215. Locking the address map insures that while the next memory 600 in the chain is being mapped, or while on the fly remapping of a given memory 600 is being performed, the mapping registers of the mapped device(s) 600 will not be overwritten.

To initiate mapping of the next memory 600 in the chain, in this example memory 600b, a command and control cycle is initiated with the command bit CMD and a set map output command SMO presented to pins IO31-27 of memory 600a. This causes memory 600a on the next clock cycle to ripple the mapping signal MAP from the memory 600a MAPOUT pin to the MAPIN pin of memory 600b. A new chip select pointer, which has preferably been generated by incrementation of the chip select pointer of the immediately prior memory in the chain (in this case 600a), is latched into the corresponding control registers 215 of memory 600b using the set starting address command SSA, as was done above. The ending address is again read back using the read ending address command REA. Master 701 locks in the address map locks in the starting and ending address for memory 600b. Master 701 stores information identifying the starting and ending addresses to memory 600b and the address prefix is again incremented. Then, MAPOUT port of memory 600b is then set active (high). The new prefix bits along with initial lower order address bits are latched into the registers of the next memory 600 in the chain and the process repeated.

The mapping procedure described above continues in a similar fashion until all the memories 600 have been mapped. At the conclusion of the mapping of the last memory 600 in the chain, the MAPOUT port of that memory is set active using the SMO command thereby signalling master 701 that mapping is complete. Master 701 can then output a mapping termination command ENDMAP which directs each of the memory devices to exit the mapping mode and return to responding to commands and addresses in a normal command mode. In other words, the commands of TABLE I again take precedence.

It should be recognized that the address space of a particular memory 600 may not require all the lower order address bits between incrementations of the prefix bits. In this case, master 701 can select a subset of lower address bits within the set of address bits associated with a value the chip select pointer bits. The master 701 may make such a selection, for example, to optimize use of its own address space. Further, two or more memories 600 could be assigned a unique subset of the lower order address bits associated with a chip select pointer. In this case, the chip pointer bits would not be incremented at the transition between the address space of one memory and that of another.

During the regular addressing mode, to access a given memory, master 701 transmits an address on the address lines bus 702 which includes the chip pointer (see Table I) identifying the target memory and burst and page pointer bits, along with any opcode bits, as described above. Each bus memory 600 compares the chip pointer with the chip pointer bits stored in its registers. When a match occurs, the burst and page pointers are input and/or latched-in by the memory 600 storing the matching prefix bits. This comparison may be implemented in any number of ways, for example by an array of exclusive-OR gates.

The toggle command palette (TABLE I) and the unlock map commands allow remapping of an individual memory 600 pointed to by the presented chip pointer.

Figure 9:
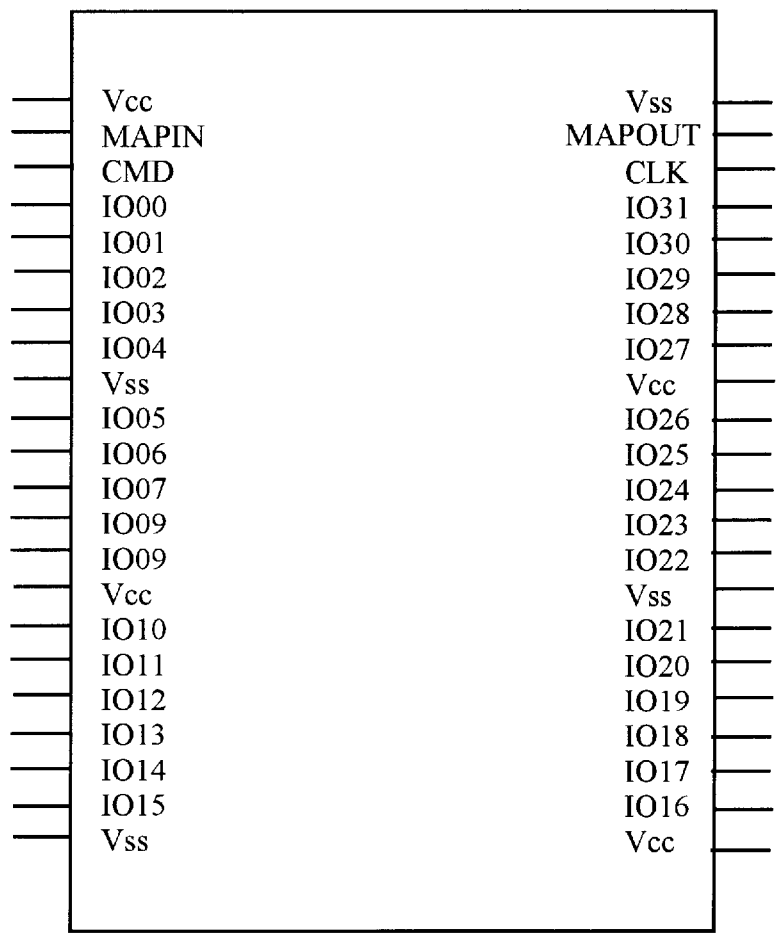
FIG. 9 is a top plan view of a preferred packaging of the memory shown in FIG. 6.

FIG. 9 is a top plan view diagram of a preferred packaging of a memory 600 in a 44-pin TSOP package. Memories such as memory 600 embodying the principles of the present invention can of course be packaged in other packages known in the art as a design choice.

Figure 10:
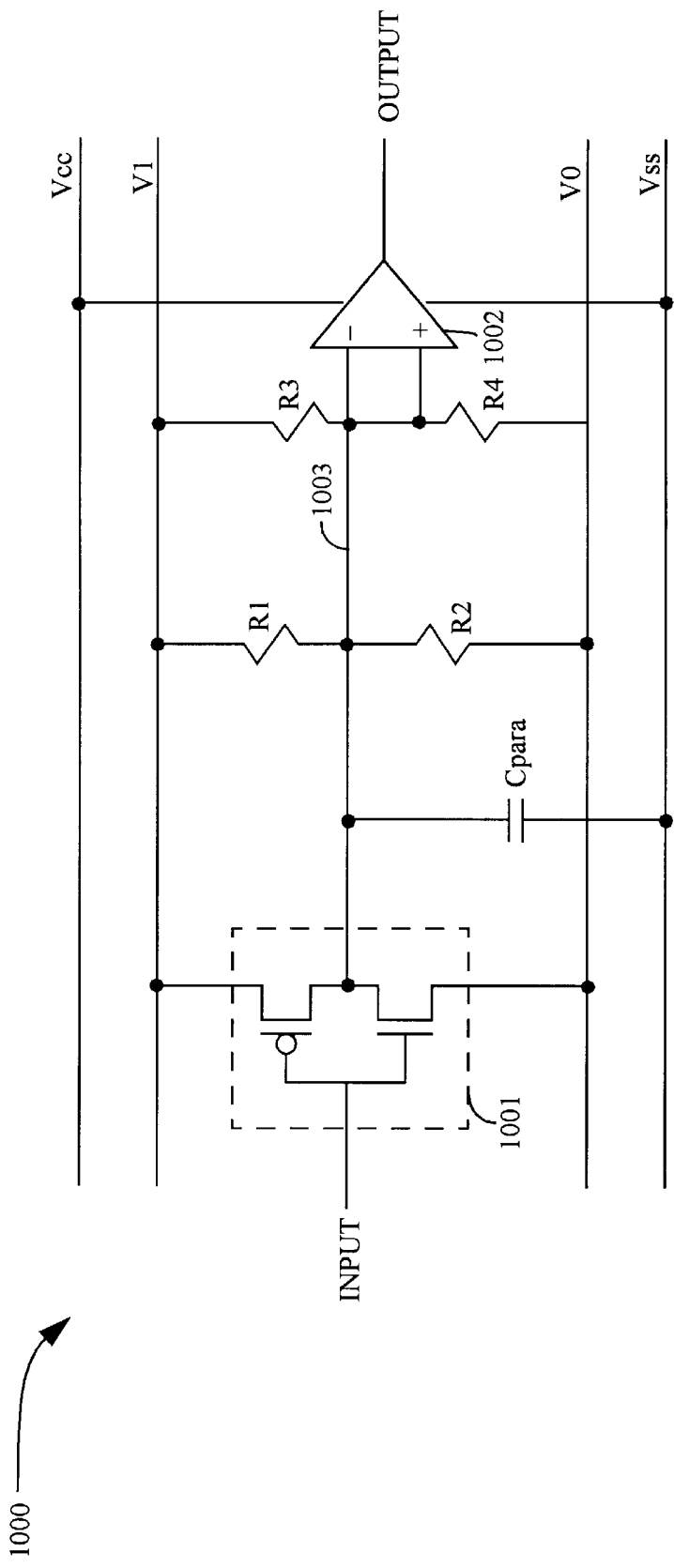
FIG. 10 is an electrical schematic diagram of a driver/receiver system suitable for use in the systems depicted in FIGS. 1 and 7.

FIG. 10 is an electrical schematic diagram of bus driver/receiver circuitry 1000 which includes a driver 1001 and a receiver 1002 for driving and receiving data or addresses across a transmission line 103. For example, driver 1001 may be within output buffers 214 for driving IO pins IO31:0, receiver 1002 within core logic 103 or system master 701 and transmission line 1003 may be a line in a local bus in system 100 or bus 702 in system 100. Conversely, driver 1001 could be within core logic 103 or system master 701, receiver 1002 within input buffers 212, and transmission line 1003 could form part of a local bus in system 100 or bus 702 in system 700. Many other applications for driver/receiver circuitry 1000 are possible. For a complete description of driver/receiver circuitry 1000, reference is now made to incorporated copending patent application Ser. No. 08/591, 864.

In FIG. 10, selected bus line 1003 is assumed to be unidirectional for discussion purposes. In other embodiments, bus line 203 could be bi-directional. Also, for discussion purposes, line driver 1001 is shown driving an output load represented by resistors R1–R4 and receiver 1002. It should be understood, however, that other output loads may vary from application to application. The capacitive loading of bus line 1003 is represented by the parasitic capacitance $C_{para}$, discussed further below.

Information (data or addresses) input to driver 1001 assumed to be generated by the associated processing circuitry from voltage rails at $V_{cc}$ and $V_{ss}$, For a CMOS embodiment, $V_{cc}$ is typically in the range of +3.3V to +5V and $V_{ss}$ is typically 0V. For discussion purposes, it will be assumed that $V_{cc}$ is 3.3V and $V_{ss}$ is 0V for the remainder of this disclosure. It should be understood, however, that such operating parameters and device parameters are merely illustrative and a wide range of other parameter values may be used without departing from the spirit and scope of the present invention.

In the illustrated embodiment, information is transmitted across bus line 1003 using a line driver 1001, which is a CMOS inverter that includes a p-channel transistor and an n-channel transistor. In alternate embodiments, driver 1001 may be noninverting. Line driver 1001 operates between voltage rails of V1 and V0, where $V_{cc} > V1 > V0 > V_{ss}$. The signal names "V1" and "V0" denote V(Logic 1) and V(Logic 0), respectively. V1 and V0 are external voltage supply levels that represent the Logic 1 and Logic 0 voltage levels that are transmitted across bus line 1003. As the input signal (information) switches from Logic 1=3.3V to Logic 0=0V, the voltage swing on bus line 1003, which is coupled to the drains of the p-channel and n-channel transistors in line driver 1001, is limited to the values of the supply rails V1 and V0, which are connected to the sources of the p-channel and n-channel transistors, respectively.

For example, if $V_{cc}$=3.3V and $V_{ss}$=0V, V1 is selected to be $V_{cc}/2+0.4$=2.05V, and V0 is selected to be $V_{cc}/2-0.4$= 1.25V, then the peak-to-peak voltage swing on bus line 1003 is (2.05−1.25)=0.8$V_{pp}$. This reduced voltage swing on bus line 1003 reduces power loss due to the parasitic capacitance, $C_{para}$, of bus line 1003, by reducing the voltage component, V, in the power loss equation $P=CV^2f$.

Bus line 1003 is coupled to the inverting input of receiver 1002 which preferably is a comparator. During transmission information, comparator 1002 compares the voltage on bus line 1003 with a reference voltage determined by the voltage divider of resistors R3 and R4 (i.e., [R4/(R3+R4)]×(V1−V0)). When no data is being transmitted, bus line 203 is "floating" at a DC bias voltage determined by the voltage divider of R1 and R2 (i.e., [R2/(R1+R2)]×(V1−V0)). In a preferred embodiment invention, R1=R2 and R3=R4, V1=$V_{cc}/2+\Delta V$ and V2=$V_{cc}/2-\Delta V$, so that the R3–R4 voltage divider reference is $V_{cc}/2$ and the DC bias voltage level on bus line 203 is also $V_{cc}/2$. R1 and R2 may be omitted, but initial switching speeds are improved when data is first transmitted if R1 and R2 are used to set the DC bias level close to $V_{cc}/2$. In an alternate embodiment of the present invention, R3 and R4 may be connected to $V_{cc}$ and $V_{ss}$, respectively, rather than V1 and V0, and the voltage reference on the non-inverting input of comparator 1002 will remain $V_{cc}/2$, provided R3 and R4 are equal.

Comparator 1002 is coupled to the $V_{cc}$ and $V_{ss}$ supply rails so that the output signal of comparator (receiver) 1002 is returned to a full voltage swing between $V_{cc}$ and $V_{ss}$. Thus, when the voltage on bus line 1003 falls below $V_{cc}/2$ (e.g., 1.25V), the voltage on the inverting input of comparator 1002 is less than the reference voltage, $V_{cc}/2$, on the non-inverting input and the output of comparator 1002 goes high to $V_{cc}$. Similarly, when the voltage on bus line 1003 rises above $V_{cc}/2$ (e.g., 2.05V), the voltage on the inverting input of comparator 1002 is greater than the reference voltage, $V_{cc}/2$, on the non-inverting input, and the output of comparator 212 goes low to $V_{ss}=0V$.

Using different power supply levels to provide power to the bus line driver/receiver circuitry offers several advantages over the prior art. While the associated processing circuitry continues to operate between $V_{cc}=3.3V$ and 0V, the line drivers, which represent a significant portion of the total power consumed by each integrated circuit, operate at a reduced voltage swing between V1 (e.g., 2.05V) and V0 (e.g., 1.25V). This reduction is power is substantial in applications such as memories 200 and 600 where the input/output ports are 32-bits wide. As a result of the power reduction, the inductive noise on the device power pins is also reduced. Further, if V1 and V0 are externally supplied, a system designer can tailor the peak-to-peak voltage swing according to system noise and power requirements. R1 and R2 may also be selected to set the D.C. bias of bus line 1003 at $V_{cc}/2$ or at some other level, according to system noise and power levels.

Figure 11:
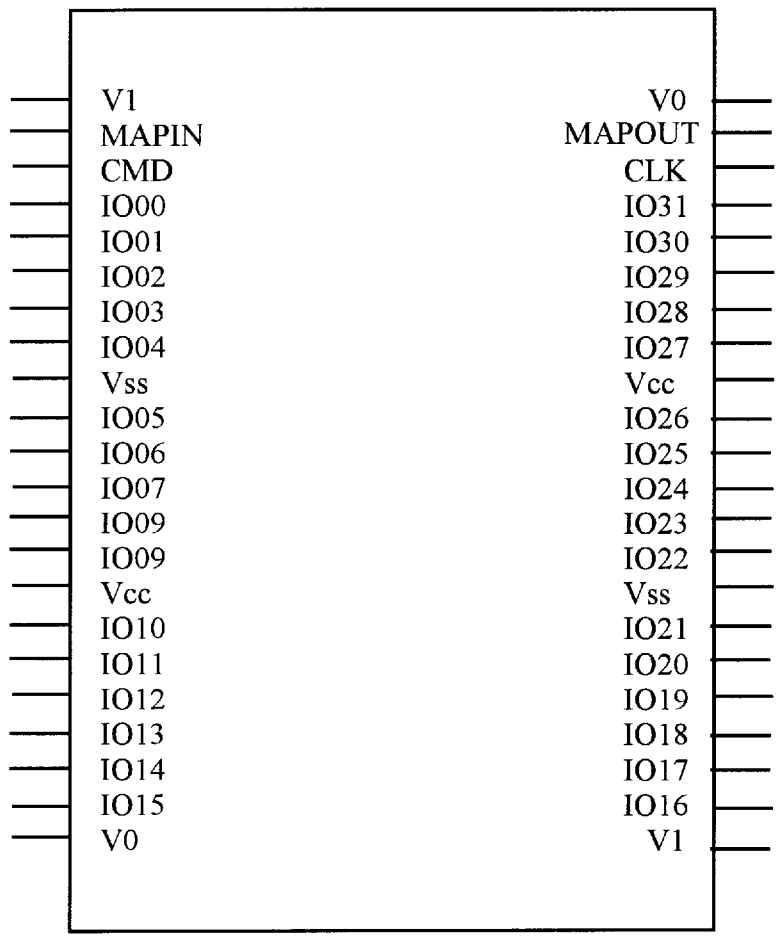
FIG. 11 is a top plan view of a preferred packaging of a memory subsystem, such as those shown in FIGS. 2 and 6, employing the driver/receiver system of FIG. 10.

FIG. 11 is a top plan schematic view of a memory system such as those shown in FIGS. 2 and 6, embodying the line driver/receiver circuitry of FIG. 10.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It is therefore, contemplated that the claims will cover any such modifications or embodiments that fall within the true scope of the invention.

What is claimed is:

1. A memory comprising:
    an array of memory cells;
    a plurality of input/output terminals for receiving control bits during control cycles and accessing selected ones of said cells during data access cycles;
    a command bit input terminal for receiving command bits for initiating said control cycles;
    a mapping input terminal for receiving a mapping enable signal to initiate a mapping mode; and
    circuitry for decoding control bits received during at least one said control cycle occurring during a said mapping mode, said control bits selecting a memory mapping operation from a palette of available memory mapping operations for mapping said memory.

2. The memory of claim 1 wherein said control bits comprise opcodes and addresses.

3. The memory of claim 2 wherein said circuitry for decoding is operable during said mapping mode to:
    during a first said control cycle, input a received address space starting address in response to a corresponding said opcode; and
    during a second said control cycle, output an address space ending address in response to a corresponding said opcode.

4. The memory of claim 3 wherein said starting address includes a unique prefix identifying an address space designated for said memory.

5. The memory of claim 4 wherein said circuitry for decoding is further operable during said mapping mode to lock in said prefix during a third said control cycle.

6. The memory of claim 1 wherein said array of memory cells comprises an array of non-volatile memory cells.

7. The memory of claim 1 wherein said array of memory cells comprises an array of volatile memory cells.

8. A memory comprising:
    an array of memory cells;
    a plurality of multiplexed terminals for accessing addressed cells in said array during data access cycles and inputting opcodes and addresses during command and control cycles;
    circuitry for addressing said array, said circuitry for addressing responding to an address set including a starting address and an ending address; and
    circuitry for mapping said address set during a mapping mode and operable to:
        during a first command and control cycle in said mapping mode, input and store said address space starting address in response to a write command selected from a palette of available mapping commands; and
        during a second said control cycle in said mapping mode, output an address space ending address in response to a read command selected from said palette of commands.

9. The memory of claim 8 wherein said addresses in said address set of said memory are associated with a unique prefix designated for said memory.

10. The memory of claim 8 wherein said mapping mode is initiated by a received mapping signal.

11. The memory of claim 8 wherein said circuitry for mapping is further operable to transition said memory from an address map unlocked state to an address map locked state in response to a lock command selected from said palette received during a third command and control cycle in said memory mapping mode.

12. The memory of claim 11 wherein said mapping mode is initiated when said mapping signal is in an active logic state and said memory is in an unlocked state.

13. The memory of claim 11 wherein said addressing circuitry comprises:
    a page pointer register for storing a page pointer received during a selected command and control cycle;
    a decoder for accessing a page in said array in response to a said page pointer stored in said page pointer register;
    a burst pointer register for storing a burst pointer received during a selected command and control cycle; and
    a decoder for accessing selected cells of a said page accessed by page pointer bits stored in said page pointer register.

14. The memory of claim 11 wherein said circuitry for mapping is further operable to output a mapping enable signal in response to a command received during a third command and control cycle in said mapping mode.

15. A memory system comprising:
    a plurality of memory devices each comprising:
        an array of memory cells;
        a plurality of multiplexed terminals for accessing addressed cells in said array during data access cycles and inputting opcodes and addresses during command and control cycles;
        an input for receiving a signal for initiating said command and control cycles;
        circuitry for addressing said array, said circuitry for addressing responding to addresses received during selected ones of said command and control cycles, said addresses including at least one bit uniquely identifying said memory device;

an input for receiving a mapping signal to initiate a mapping mode; and circuitry for decoding control bits received during control cycles occurring during said mapping mode, said control bits effectuating a memory operation selected from a palette of available memory operations for mapping a set of addresses for accessing said cells of said array; and a system master operable to:

present a mapping signal to a first one of said memory devices to initiate mapping of said first memory device;

present a signal to initiate a first command and control cycle;

present a starting address including at least one bit uniquely identifying said first memory device and a command to write said starting address into said first memory device;

present a signal to said first memory device to initiate a second command and control cycle; and present a read command to read back an ending address for said first memory.

16. The memory system of claim 15 wherein said system master is further operable to:

present a signal to said first memory device to initiate a third command cycle; and present a command to said first memory device commanding said first memory device to output a mapping signal to a second said memory device.

17. The memory system of claim 16 wherein said system master is further operable to:

present a signal to said second memory device to initiate a command cycle; and write a starting address into said second memory device, said starting address having at least one bit uniquely identifying said second memory device.

18. The memory system of claim 17 wherein said at least one bit identifying said second memory device is generated by said system master by incrementing from said at least one bit uniquely identifying said first memory device.

19. The memory system of claim 15 wherein said system master is further operable to:

present a signal to initiate a third command and control cycle;and present a lock command to said first memory device to lock-in a bit uniquely identifying said first memory.

20. A method of mapping a memory device having an array of memory cells, a plurality of input/output terminals for receiving control bits during control cycles and accessing selected ones of the cells during data access cycles, a command bit input terminal for receiving command bits for initiating the control cycles, a mapping input terminal for receiving a mapping enable signal to initiate a mapping mode and circuitry for decoding control bits received during at least one control cycle in the mapping mode to allow mapping of a set of addresses for accessing the cells in the array, the method comprising the steps of:

presenting a mapping enable signal to the mapping input to initiate a mapping mode;

presenting a first command bit to the command input terminal to initiate a first control cycle;

presenting an address write command at selected ones of said input/output terminals, said write command selected from a command palette;

writing a starting address presented to at least one of the input/output terminals into the memory the starting address bit including at least one bit uniquely identifying the memory;

presenting a second command bit to the command input terminal to initiate a second control cycle;

presenting an address read command at selected ones of said input/output terminals, the read command selected from the command palette; and reading an ending address from the memory.

21. The method of claim 20 and further comprising the step of determining the ending address, comprising the substeps of:

presenting a sequence of addresses to selected ones of the input/output terminals during the mapping mode; and comparing each of the sequence of addresses with a stored address indicative of end of the address space, the ending address indicated when the sequence matches the stored address.

22. The method of claim 20 and further comprising the step of determining the ending address, comprising the substep of concatenating the at least one prefix bit with a stored address indicative of the end of the address space of the memory.

23. The method of claim 20 and further comprising the steps of:

presenting a third command bit to the command input terminal to initiate a third control cycle; and presenting a lock command at selected ones of the input/output terminals to lock at least the at least one prefix bit into the memory.

24. The method of claim 20 and further comprising the steps of:

presenting a third command bit to the command input terminal to initiate a third control cycle; and presenting a command at selected ones of the input/output terminals to cause the memory to output a mapping enable signal.

* * * * *